US009473266B1

(12) United States Patent
Patapoutian et al.

(10) Patent No.: US 9,473,266 B1
(45) Date of Patent: Oct. 18, 2016

(54) SCHEDULING STRATEGIES FOR ITERATIVE DECODERS

(75) Inventors: Ara Patapoutian, Hopkinton, MA (US); Bruce Buch, Westborough, MA (US); Rose Shao, Worcester, MA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 2180 days.

(21) Appl. No.: 12/473,728

(22) Filed: May 28, 2009

Related U.S. Application Data

(62) Division of application No. 11/625,920, filed on Jan. 23, 2007, now abandoned, which is a division of application No. 10/454,326, filed on Jun. 4, 2003, now Pat. No. 7,266,750.

(60) Provisional application No. 60/394,849, filed on Jul. 10, 2002.

(51) Int. Cl.
*G06F 11/00* (2006.01)
*H04L 1/00* (2006.01)

(52) U.S. Cl.
CPC .................................. *H04L 1/0057* (2013.01)

(58) Field of Classification Search
CPC . H04L 1/0045; H04L 1/0057; H04L 1/0061; H04L 1/0071; G11B 20/18
USPC ........................................................ 714/746
See application file for complete search history.

(56) References Cited

U.S. PATENT DOCUMENTS

| 5,157,671 | A | * | 10/1992 | Karplus ......................... 714/752 |
| 5,640,286 | A | | 6/1997 | Acosta et al. |
| 5,659,557 | A | | 8/1997 | Glover et al. |
| 5,802,078 | A | | 9/1998 | Urabe et al. |
| 5,974,580 | A | | 10/1999 | Zook et al. |
| 6,006,321 | A | | 12/1999 | Abbott |
| 6,307,901 | B1 | * | 10/2001 | Yu et al. ......................... 375/341 |
| 6,633,856 | B2 | | 10/2003 | Richardson et al. |
| 6,671,852 | B1 | * | 12/2003 | Ariel et al. ..................... 714/793 |
| 6,718,508 | B2 | | 4/2004 | Lodge et al. |
| 6,751,770 | B2 | | 6/2004 | Morelos-Zaragoza |
| 6,757,117 | B1 | | 6/2004 | Livingston |
| 6,842,873 | B1 | | 1/2005 | McLaughlin et al. |
| 6,895,547 | B2 | | 5/2005 | Eleftheriou et al. |
| 6,938,196 | B2 | * | 8/2005 | Richardson et al. ......... 714/752 |
| 6,965,652 | B1 | | 11/2005 | Burd et al. |
| 7,266,750 | B1 | | 9/2007 | Patapoutian et al. |
| 8,661,325 | B2 | * | 2/2014 | Chaichanavong . G11B 20/1426 714/746 |
| 8,689,084 | B1 | * | 4/2014 | Tai ....................... H03M 13/112 714/24 |
| 2003/0033570 | A1 | | 2/2003 | Khannanov et al. |
| 2004/0054960 | A1 | * | 3/2004 | Eroz et al. ..................... 714/800 |
| 2004/0109507 | A1 | * | 6/2004 | Kanter et al. ................. 375/259 |
| 2010/0037125 | A1 | * | 2/2010 | Argon et al. ................. 714/800 |
| 2011/0055655 | A1 | * | 3/2011 | Hocevar ....................... 714/752 |

* cited by examiner

*Primary Examiner* — Albert Decady
*Assistant Examiner* — Enam Ahmed
(74) *Attorney, Agent, or Firm* — HolzerIPLaw, PC

(57) ABSTRACT

An iterative decoder is controlled to iteratively decode a block by performing one or more decoding iterations for the block. The iterative decoder uses a parity-check matrix and can be configured to process that parity-check matrix for parallel, sequential or a combination of parallel and sequential ("hybrid") parity constraint updates.

19 Claims, 12 Drawing Sheets

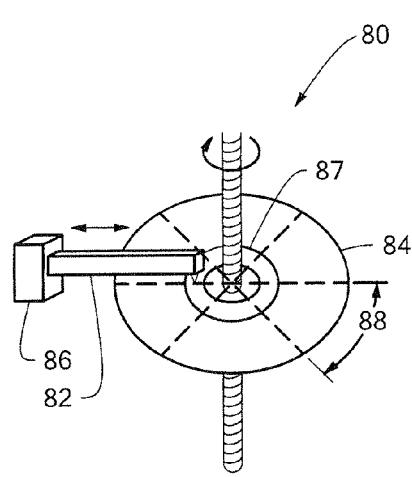
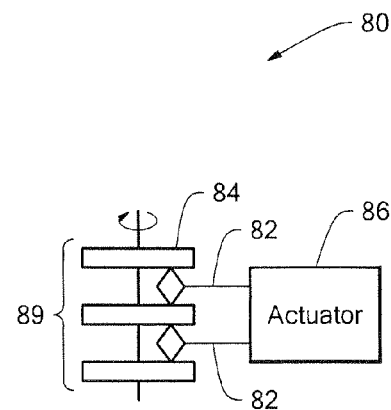
FIG. 4A  FIG. 4B
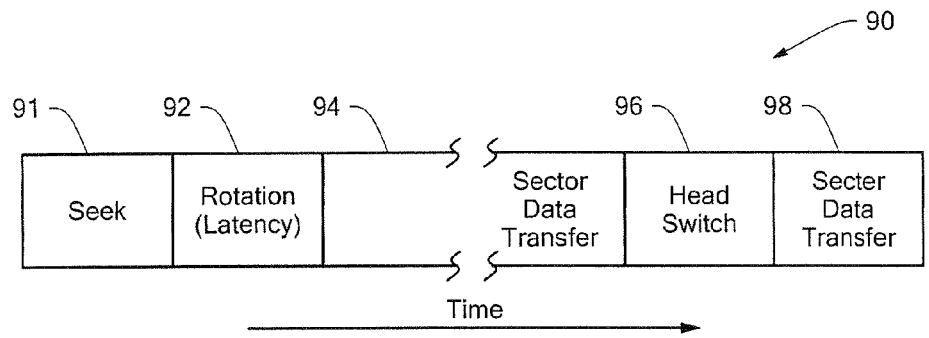
FIG. 5
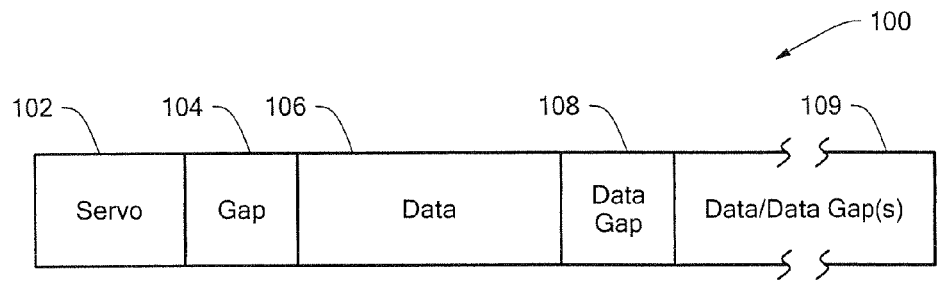
FIG. 6

SCHEDULING STRATEGIES FOR ITERATIVE DECODERS

CROSS-REFERENCE TO RELATED APPLICATIONS

The present application is a divisional of commonly assigned copending U.S. patent application Ser. No. 11/625,920, which was filed on Jan. 23, 2007, by Ara Patapoutian et al. for SCHEDULING STRATEGIES FOR ITERATIVE DECODERS, which was a divisional of U.S. patent application Ser. No. 10/454,326, which was filed on Jun. 4, 2003, by Ara Patapoutian et al. for ERROR RECOVERY STRATEGIES FOR ITERATIVE DECODERS (and issued on Sep. 4, 2007 as U.S. Pat. No. 7,266,750), which itself claims priority to provisional Application No. 60/394,849, filed on Jul. 10, 2002, and the contents of all of which are hereby incorporated by reference.

BACKGROUND OF THE INVENTION

1. Field of the Invention

The invention relates to iterative decoding.

2. Background Information

Present day storage systems employ a number of different techniques to eliminate errors that may occur during a data readback process. Every block that is read is decoded "on-the-fly" in a single read attempt, after some number of rereads or during a data recovery procedure. Typically, the "on-the-fly" decoding and the rereads are performed by a hardware decoder. When a reread operation is performed, the operating conditions are varied slightly, for example, by offsetting the transducer from the center of the track, to obtain a slightly different waveform. The reread operations repeat until the erroneous data are corrected or a predetermined number of reread operations has been performed, at which point the reread process may be terminated and a firmware-implemented data recovery procedure takes over.

It is possible to perform rereads and data recovery procedures to improve performance as long as the throughput of the storage system is not unacceptably degraded. Preferably, for example, a storage system is designed to ensure that reread and data recovery procedures do not slow the throughput by more than a predetermined throughput specification, e.g., 0.5%. Additionally, the system can ensure compliance with a reliability specification, for example, a reliability specification of $10^{-12}$, which specifies that no more than one block out of $10^{12}$ blocks read should fail to return correct data after a prescribed number of rereads and data recovery procedures are exercised. At present there are very clear boundaries between the "on-the-fly", reread and firmware-implemented data recovery modes. What matters most, however, is that the two fundamental specifications of throughput and reliability, are satisfied.

Iterative decoding is a class of powerful detector/decoder architectures in which the detector provides symbol reliability values to the decoder and the decoder in turn provides reliability values back to the detector. These architectures are called "iterative" since the detector and decoder may update each other multiple times until the decoding process converges to the correct data. One example of such an iterative system applies the so-called Low Density Parity Check (LDPC) code. When many iterations between the detector and decoder are allowed, it is possible to achieve a significant performance gain (e.g., approximately 3 dBs for 100 iterations) relative to other architectures such as the Reed-Solomon (RS) decoders. Unfortunately, implementing just a single iteration in hardware is a major challenge in terms of hardware complexity, and implementing many more iterations can be extremely costly. On the other hand, when only a few iterations in hardware are allowed, much of the performance improvement is lost, e.g., a 3 dB gain for 100 iterations may be reduced to a single dB for as few as two iterations.

Typically, in prior RS approaches, a fixed lower level of redundancy decoding is used in the "on-the-fly" mode while a full redundancy decoding is used in the firmware-implemented data recovery mode in order to reduce complexity in the hardware. Thus, the error correction coding (ECC) power included in the on-the-fly decoder is less than full power, typically just enough to satisfy the throughput specification. The reliability specification is satisfied by using the full ECC power in firmware in addition to the rereads. Such an approach for iterative decoders is problematic. As discussed earlier, the hardware implementation of an iterative decoder becomes extremely complex and costly since the capability to perform multiple iterations requires the duplication of the detector and decoder blocks many times over. Moreover, since iterative decoders are massively parallel and complex blocks, a firmware implementation is extremely time consuming.

SUMMARY OF THE INVENTION

In one aspect, the invention provides methods and apparatus for decoding. The methods includes (i) receiving a block of data from a data channel, (ii) directing a hardware decoder to iteratively decode the block, the hardware decoder performing one or more decoding iterations for the block during a predetermined block time, and (iii) controlling the hardware decoder to perform more decoding iterations for the block during a time in which the hardware decoder is available, if the block fails to converge to correct data during the predetermined block time.

Embodiments of the invention may include one or more of the following features. The hardware decoder can include a soft output detector and a decoder. The decoder can be an iterative decoder such as a Low Density Parity Check (LDPC) decoder. Controlling the hardware decoder can include storing information usable to perform more decoding iterations for the block in a local buffer, detecting a time during which the hardware decoder is available and providing the buffered information to the hardware decoder. The data channel can include a storage device in a data storage system and the time can include overhead time during which the data storage system is reading control information. The control information can include servo information, header information or gap information. The time can include overhead time during which the data storage system is seeking a subsequent block in a non-sequential read mode, or head switching time. The information stored in the local buffer can include information indicative of the state of the iterative decoding of the block at the end of the predetermined block time, or information representing a waveform of the block. Controlling the hardware decoder can further include moving the buffered information between the local buffer and a DRAM. For each iteration, the hardware decoder can perform updates of parity constraints based on a predetermined parity-check matrix in a sequential manner.

In another aspect, the invention provides methods and apparatus for decoding. The method of decoding includes (i) providing blocks of data received from a data channel to a buffer at a fixed data transfer rate, (ii) transferring the blocks from the buffer to a hardware decoder at a second, variable data transfer rate and (iii) iteratively decoding each block in the hardware decoder until the iterative decoding causes such block to converge to correct data or causes the buffer to overflow.

In yet another aspect, a method of decoding includes providing a parity-check matrix comprising parity and processing a data block by performing one or more iterations of decoding, each iteration comprising sequential updating of parity constraints for the parity-check matrix.

In still yet another aspect of the invention, a method of decoding includes providing a parity-check matrix and processing a data block by performing one or more iterations of decoding, each iteration comprising updating groups of parity constraints for the parity-check matrix sequentially, each group comprising a subset of parity constraints that are updated in parallel.

Particular implementations of the invention may provide one or more of the following advantages. The decoding mechanism of the present invention minimizes the probability of performing a firmware data recovery procedure when hardware-implemented "on-the-fly" iterations are few (e.g., 2). It also allows use of full error correction capability for all hardware decoding iterations, whether they be performed "on-the-fly" or at some later time when the hardware decoder would otherwise be idle (for example, while the system is seeking, switching heads, processing overhead fields, and so forth). Also, the hardware decoder can be implemented to perform parity check matrix processing in a sequential or parallel/sequential ("hybrid") manner for improved performance.

Other features and advantages of the invention will be apparent from the following detailed description, and from the claims.

BRIEF DESCRIPTION OF THE DRAWINGS

FIGS. 4A and 4B show a top and side view, respectively, of a disk arrangement of a head-disk assembly controlled by the disk controller of FIG. 2.

FIG. 5 is a timing diagram depicting a sequence of activities occurring in an exemplary disk access operation.

FIG. 6 is an exemplary sector format.

Like reference numerals will be used to represent like elements.

DETAILED DESCRIPTION OF AN ILLUSTRATIVE EMBODIMENT

Figure 1:
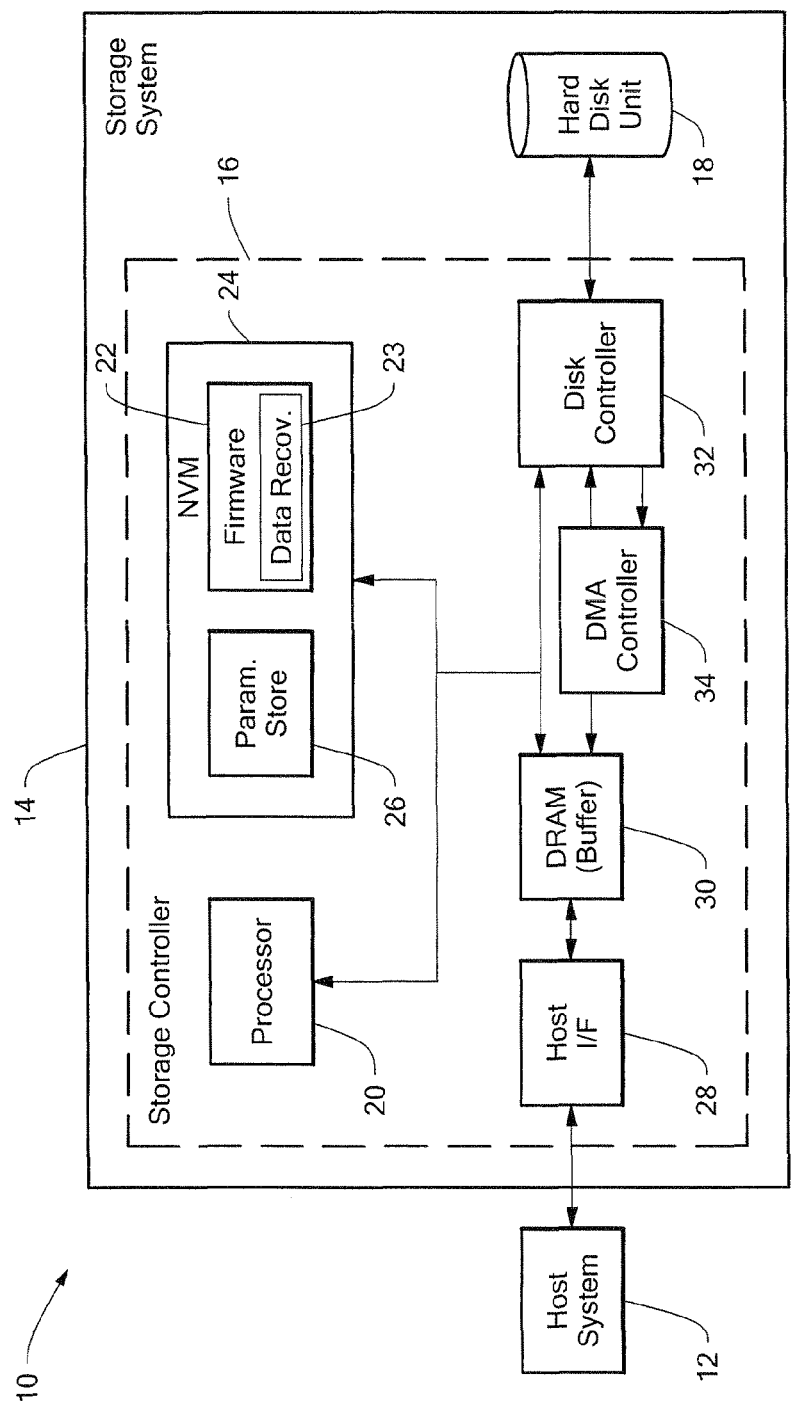
FIG. 1 is a block diagram of a data processing system including a storage system.

Referring to FIG. 1, an exemplary data processing system 10 is shown. The data processing system 10 includes a host system or computer 12 coupled to a storage system 14. In the illustrated embodiment, the storage system is a disk drive. The storage system 14 includes a storage controller 16 coupled to a storage device, shown as a hard disk unit 18. The hard disk unit 18 is intended to represent a head disk assembly (HDA) as well as spindle, motor, actuator and other conventional drive components not included in the storage controller 16.

In the illustrated embodiment, the storage controller 16 is implemented as an intelligent storage controller. Thus, the storage controller 16 includes a processor 20 and firmware 22 to control the overall operations of the storage system 14. The storage controller 16 further includes a memory (shown as a nonvolatile memory, "NVM") 24, which stores a copy of the firmware 22 and any required parameter data in a parameter store 26, and is read each time the storage system 14 boots. The firmware 22 may be copied to a volatile memory, for example, a RAM located in the processor 20 or elsewhere in the storage system, at initialization for subsequent execution by the processor 20. The firmware 22 includes routines required to handle host commands, as well as other routines, for example, a data recovery procedure 23.

The storage controller 16 also includes a host interface 28 that interfaces the storage controller 16 to the host system 12, and a data buffer 30 (e.g., DRAM, as shown), which buffers data being transferred between the host computer 12 and the hard disk unit 18 as well as stores commands provided by the host computer 12 to the storage controller 16.

The host system 12 writes commands and data to the data buffer 30, and reads status and data from the data buffer 30. Commands sent from the host system 12 can be higher-level commands, such as reading a file by name. The processor 20 executes the firmware 22 to translate host commands from the host system 12 into more detailed command sequences required by the disk controller 32 to implement the command.

The storage controller 16 also includes a disk controller 32, which is operatively coupled to the hard disk unit 18 as well as the processor 20 and data buffer 30. The disk controller 32 performs a variety of drive control functions. For example, it provides the motor control and control signals to enable the HDA.

In one implementation of the storage controller 16, as shown in FIG. 1, the storage controller 16 employs a DMA controller 34 to optimize data transfer operations. The DMA controller 32, which is coupled to the disk controller 32 and the data buffer 30, is used by the disk controller 32 to transfer data from the hard disk unit 18 to the data buffer 30.

Figure 2:
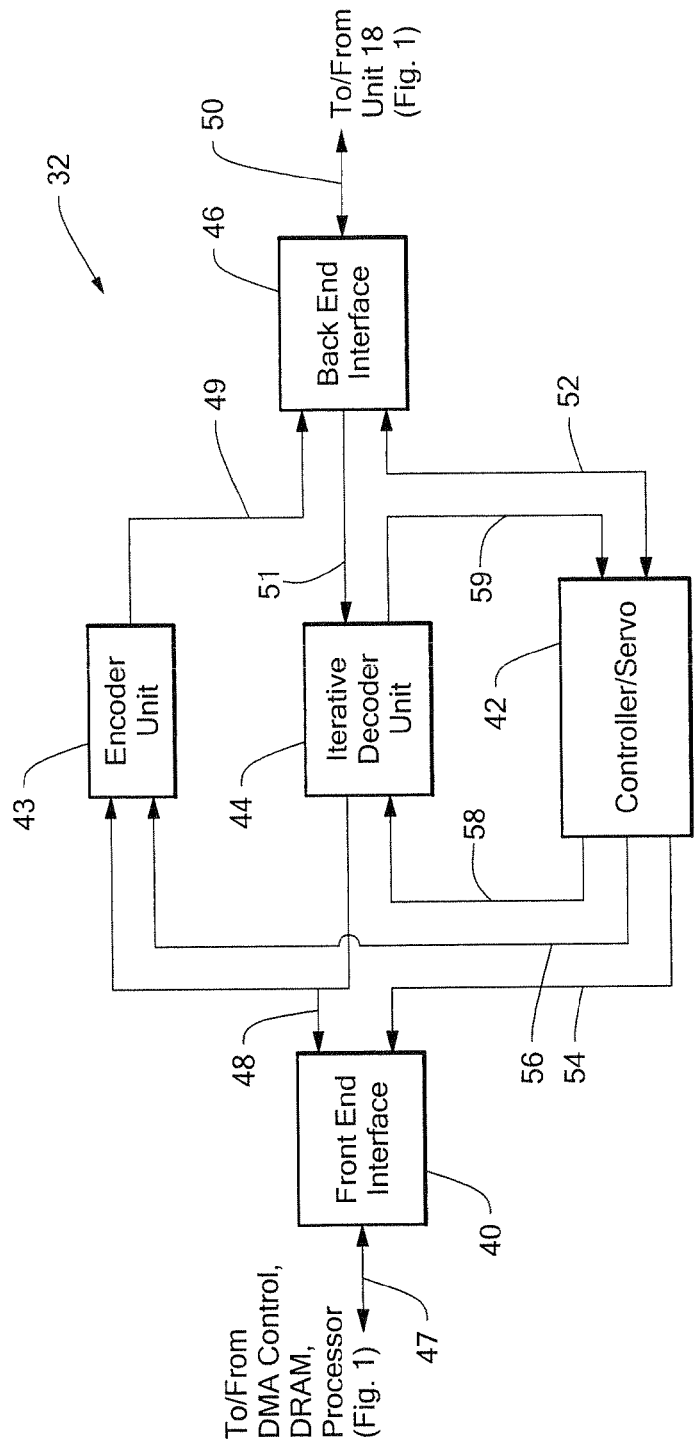
FIG. 2 is a block diagram of a disk controller in the storage system of FIG. 1.

Referring to FIG. 2, an exemplary embodiment of the disk controller 32 includes a front end interface 40, a controller/servo unit 42, an encoder unit 43, a decoder unit 44 and a back end interface 46. Data to be written to the hard disk unit 18 is provided over bus 47 to the front end interface 40, which provides the data to the encoder 43 via bus 48. The encoder unit 43 encodes the data and provides the encoded data to the back end interface 46 over bus 49. The back end interface 46, which includes the read channel, provides the encoded data to the hard disk unit 18 over an output bus 50.

During a read back operation, the back end interface 46 transfers the encoded read data from the hard disk unit 18 to the decoder unit 44 over a bus 51. The decoder unit 44 provides decoded data to the bus 48 for transfer to the host system (via the DMA controller 34, data buffer 30 and host interface 28 of FIG. 1).

It will be appreciated that the embodiment shown in FIG. 2 is merely intended to illustrate a functional partitioning of the disk controller 32. The physical implementation of the disk controller functionality is a matter of design choice and thus can take any number of different forms. That is to say, the illustrated functional units need not be implemented separately, and various functional units, e.g., the controller 42, may be implemented with one or more integrated circuits.

The controller/servo unit 42 includes read/write control and servo logic, and thus provides the appropriate disk control signals 52 to supervise the recording of data on and retrieval of data from one or more disks in the hard disk unit 18. It also provides one or more front end interface control signals 54 to control operation of the front end control 40, as well as provides control signals to encoder and decoder units. The controller 42 thus provides encoder control signals 56 that direct the encoder unit 43 to encode data written to the hard disk unit 18 and provides decoder control signals 56 that direct the decoder unit 44 to decode the coded data as it is read back from a disk in the hard disk unit 18. The decoder unit 44 provides decoder output control signals 59 to the controller 42 to convey status of decoding operations, as will be described.

The exemplary storage system 14 as thus described with reference to FIGS. 1 and 2 is intended to illustrate only those aspects of the storage system 14 which pertain to iterative decoding within the context of data reads. Hence, some functions are omitted and others simplified to a level appropriate to a discussion of the iterative decoding process as follows.

The error correcting code employed by the disk controller 32 is a single level iteratively decodable code, such as a Low Density Parity Check Code (LDPC), product code or the like. More particularly, the decoder unit 44 is an iterative decoder unit and is therefore configured to perform an iterative decoding algorithm, as will be discussed in further detail below.

Referring back to FIGS. 2 and 3, like conventional decoding architectures, the storage controller 16 supports an "on-the-fly" decoding, that is, decoding which occurs in the stream of an initial read attempt, in hardware, and a firmware-implemented data recovery procedure in firmware. Hardware-based rereads may also be supported. The iterative decoding unit 44 (of the disk controller 32, shown in FIG. 3) is utilized for the hardware decoding and the data recovery process 23 in firmware 22 (shown in FIG. 2) is invoked for data recovery procedures.

A goal of the architecture of disk controller 32 is to minimize the probability of going to the firmware data recovery mode when the hardware-implemented "on-the-fly" decoding iterations are few (e.g., 2). This goal is achieved by controlling the decoder hardware, that is, decoder unit 44, to perform additional iterations. Thus, in accordance with the present invention, the disk controller 32 uses an "on-the-fly" hardware decoding mode and an "extended" hardware decoding mode, both having the same redundancy level but using a different number of iterations. In one embodiment, for an extended hardware decoding mode of operation, as will be described, the controller 42 (of the disk controller 32) controls the decoder unit 44 to perform more iterations at times when the decoder unit 44 would otherwise be idle. The "on-the-fly" hardware decoding includes a predetermined number of iterations. If necessary, when the block fails to converge to correct data within the predetermined number of iterations, the decoder unit 44 is used in the extended hardware decoding mode to perform additional iterations. A desired throughput specification, e.g. $10^{-6}$, is satisfied by the 'on-the-fly' hardware decoding with a fixed number of iterations, together with the extended hardware decoding with a variable number of iterations dependent upon the time and buffer space permitted. The reliability specification, e.g., a block failure rate of $10^{-12}$, is satisfied by the firmware data recovery decoding (and rereads if performed).

Figure 3:
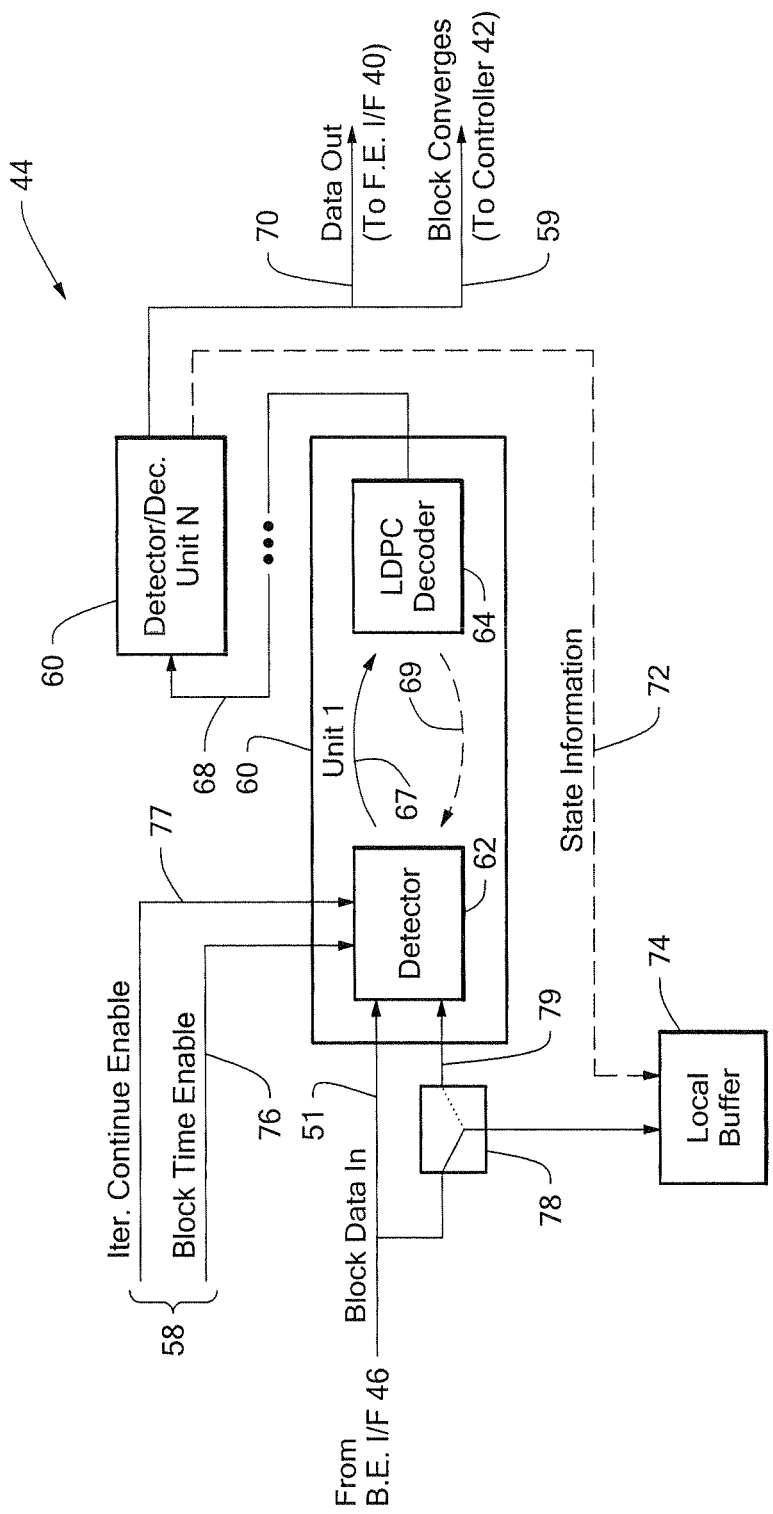
FIG. 3 is a block diagram of one exemplary embodiment of an iterative decoder unit controlled by the disk controller of FIG. 2 to perform hardware "on-the-fly" and data recovery decoding iterations in accordance with the present invention.

Referring to FIG. 3, in one exemplary embodiment, the decoder unit 44 includes "N" units 60 connected in a cascaded fashion. Each unit 60 includes a soft output detector 62 coupled to a decoder shown as a LDPC decoder 64. The use of a LDPC decoder to illustrate embodiments of the invention is chosen as a matter of convenience, as an example likely to be familiar to those skilled in the art. The concepts disclosed and explained herein are equally applicable to any iterative decoding technique, as mentioned earlier.

The detector 62 receives a block from the disk unit 18 via the back end interface 46 as a first input over bus 51. Collectively, the disk unit 18 and the back end interface 46 may be referred to generally as the data channel. The detector 62 generates from the block probabilistic (soft) information 67, which it passes to the LDPC decoder 54. As a multi-stage unit, the LDPC decoder results 68 of the current stage (current iteration) are passed to the detector 62 in the next stage 60 for the next iteration. Alternatively, in a single stage unit operating at a faster clock rate to run N iterations in a single block time, the LDPC results are passed to the detector in that same stage, via feedback 69 (shown in dotted lines in the figure). Other implementations which incorporate aspects of both single stage and multi-stage unit can be used as well.

Thus, the detector 62 and LDPC decoder 64 will update each other multiple times until the decoding process either converges to the correct data or the "on-the-fly" processing of the block time terminates. Collectively, the units 60 perform, in an on-the-fly hardware decoding mode, "N" decoding iterations for a predetermined block time. It should be noted that the number of iterations (between detector 62 and decoder 64) need not necessarily be an integer. Furthermore, the decoder 64 itself may be iterated some number of times which, like N, need not be an integer.

The encoder unit 43 (from FIG. 2) receives input bits of a block, encodes them according to LDPC code construction, which may be a generator matrix based on the parity-check matrix, and provides as output the n-bit coded block or codeword "x". The block "x" as read from the channel, referred to as block "x'", may be corrupted as a result of some channel disturbance or noise, such as signal-dependent transition noise (e.g., position jitter), or inter-symbol interference (ISI). Thus, the decoding process of the decoder 44 operates to estimate the coded block "x" that was provided to the channel during recording from an erroneous coded block "x' received during a read back operation. The decoding process is iterated multiple times to improve the decoding reliability, and bit decisions are made in the final, successful iteration.

As is known in the art, a LDPC code is defined by a large, very sparse, non-systematic, parity-check matrix. As an example, a regular LDPC or Gallager code can be denoted as an (n, j, k) LDPC code and is defined by a parity-check matrix of "m" rows and "n" columns, with "j" ones in every column, "k" ones in every row, and zeros everywhere else. The parity-check matrix completely describes the code by requiring valid codewords to satisfy the expression "H*x=h" where "H" is the parity-check matrix, "x" is an n by 1 codeword, and the vector "h" is a syndrome vector having zero-one syndrome entries (or parity constraints) corresponding to whether even or odd parity is imposed by each parity check equation of the "H*x=h" expression. Usually h is the all zero vector. Each column of the parity-check matrix corresponds to a particular transmitted bit of x, and each row corresponds to a particular checksum. For each LDPC iteration, all of the rows of the parity-check matrix of the LDPC code are processed. For a LDPC decoder implementation, any LDPC decoding procedure, for example, those originally described by Robert G. Gallager in his book "Low-Density Parity-Check Codes," The M.I.T. Press, 1963, or those described by J. Hagenauer, E. Elke and L. Papke, in "Iterative decoding of binary block and convolutional codes", IEEE Trans. Info. Theory., Vol. 42, No. 2, March 1996, or in U.S. Patent Application No. US2003/0033575A1, entitled "Method and Apparatus for Decoding LDPC Codes", in the names of T. Richardson and V. Novichkov, can be used.

In one embodiment, the detector 62 may be configured to perform the well-known "BCJR" algorithm (also referred to as the "forward-backward" algorithm). Details of the BCJR algorithm can be had with reference to a paper by L. R. Bahl, J. Cocke, F. Jelinek and J. Raviv, entitled "Optimal Decoding of Linear Codes for Minimizing Symbol Error Rate," IEEE Trans. Info. Theory, Vol. 20, pp. 248-87, March 1974, which is incorporated herein by reference. The BCJR algorithm provides the a posteriori probabilities (APP) of the coded bits sent through the channel, which in turn can be used as soft information. Of course, other types of soft output detectors can be used as well.

Still referring to FIG. 3, once the N iterations have been performed, the LDPC decoder 64 (in the last detector/decoder stage 60, if multiple stages are used) provides via control signal 59 an indication if the iterative decoding converged on the correct data. If it did, the LDPC decoder 64 provides the decoded block data over a data output bus 70. Otherwise, if the signal 59 indicates that further iterations are needed, the LDPC decoder 64 is directed to store state information (data in) 72 describing the state of the iterative decoding in a local buffer 74. Alternatively, or in addition, the decoder unit 44 may save a copy of the block (block data in 51) in the local buffer 64 when it is received.

The controller 42 signals the beginning of the block time (N "on-the-fly" decoding iterations) via a block time enable 76. It uses a second enable, shown as "Iteration Continue Enable" 77, to signal that additional iterations are to begin. At the same time, the controller 42 provides either buffered state information or block data, or both, to the detector 62 (of the first unit or stage 60, if more than one stage is used). The decoding unit 44 then uses this information to either resume decoding iterations where the on-the-fly mode left off (at iteration N+1), or start from scratch (beginning with a first iteration). A switch 78 may be used to connect the local buffer 64 to the first input 51 or a second input 79, depending on whether data is being stored in the buffer 74 (in which case the first input 51 is selected) or being retrieved for further decoding iterations (in which case the second input 79 is selected). The incoming data received on first input 66 may be buffered in another buffer (not shown) as it is received from the back end interface 46. In another implementation, the first input 66 could be coupled to two buffers, with one buffer storing the incoming block data and the other buffer maintaining a copy of block data that requires further iterations, and select the appropriate buffer (for example, using a switch like switch 78).

In essence, therefore, the controller 42 operates to enable the extended hardware decoding mode by re-using the decoding unit hardware to perform more iterations than are allowed during a given block time during the "on-the-fly" hardware decoding mode.

The local buffer 74 may be a dedicated buffer that stores "M" blocks. When the required number of buffers becomes large, however, this approach may become expensive. Thus, it may be desirable to keep M very small (e.g., M=3) and instead use the drive buffer memory (e.g., DRAM 30) to store the block data awaiting further decoding iterations.

The additional iterations are allowed to occur when the storage system is busy with overhead-related activities, such as seeks, head switches and reads of track and sector control information, and thus at times when the decoder unit 44 would otherwise be idle, so that throughput is not degraded.

FIG. 4A shows top view of a typical hard disk arrangement 80 in which a read/write head 82 is moved radially across a disk 84 by a precision actuator 86 to a selected track 87. Each track 87 is divided into multiple sectors 88. As shown in FIG. 4B, the amount of storage can be increased by providing multiple disks 84 in a stack 89 on one spindle. Each disk surface is given its own read/write head 82, except the outer two surfaces, in order to improve access time. The access time of a disk is made up of seek time (time for head to reach the required track), rotational latency (time for the disk to rotate to the desired sector) and the time to access the data in the sector. The access time to the data is relatively short in comparison to the other times. The time required to move from one track to an adjacent track is called track-to-track access time.

For example, and as illustrated in FIG. 5, a disk access operation could include a sequence 90 of the following: a seek 91; disk rotation (rotational latency) 92; sector data transfer 94; head switch 96; and another sector data transfer 98. The seek time and rotational latency, as well as head switch time, are overhead times during which the additional iterations may be performed.

In addition, times during which sector control information fields are processed during the sector data transfers are also available for this use. FIG. 6 shows an exemplary sector format 100 which includes a servo field 102 followed by a gap 104, a data field 106 and a data gap 108. The data gap 108 may be followed by additional data and gap fields, as indicated by reference numeral 109. The data field 106 provides the user data. Thus, the gap and servo fields provide further opportunity for additional iterations. The servo field 102 indicates the track and sector address of the data record, as well as provides servo positioning information to locate the head over a given track. The data field 106 provides the data block plus any checksum or cyclic redundancy check. The data gap 108 is a buffer that allows the head to prepare for the next sector by switching to read mode if the previous sector involved writing data.

In practice, the amount of time available from one or more of these activities, e.g., seeks, head switching and so forth, depends on the type of read operation that is being performed. For example, in a random read operation, a significant portion of time is spent seeking the location of a block. The iterative decoder hardware is available during the time that the head is seeking the block location. Thus, when a block being decoded does not converge in N iterations, rather than going to firmware error recovery mode and degrading throughput, the controller 42 directs the decoder unit 44 to perform additional iterations for a current or buffered block while the storage system stays idle or seeks the next block. In random seek mode, therefore, firmware error recovery mode can be practically eliminated. For example, in a 15K rpm drive, if head switch time or 1 track seek time is 0.4 ms, then an additional 400 us (100 block times) are available per 1000 blocks (per revolution). Assuming it is possible to perform two iteration per block time, an extra 200 iterations per revolution can be realized.

Even in sequential read mode there may be, for example, 10% overhead to perform a head switch or a single track seek. During that time, the decoder unit 44 is not needed for "on-the-fly" hardware decoding. As in the case of the random read mode described above, the overhead time occurring during the sequential read mode can be used by the detector/decoder hardware for further iterations of the blocks that otherwise would need firmware error recovery procedures to recover the block data.

In addition to head switching or a single track seek, further performance improvement can be achieved by utilizing the sector "overhead" fields (such as those shown in FIG. 6), that is, fields for which the iterative detector/decoder is not utilized, as mentioned earlier. Again, if these fields are about 10%, for example, it may be possible to gain on average about 200 additional iterations per revolution. With respect to sequential reads, timing associated with these overhead fields may provide an increase in the effective average hardware iterations, say, from 2 to 2.2.

Figure 7:
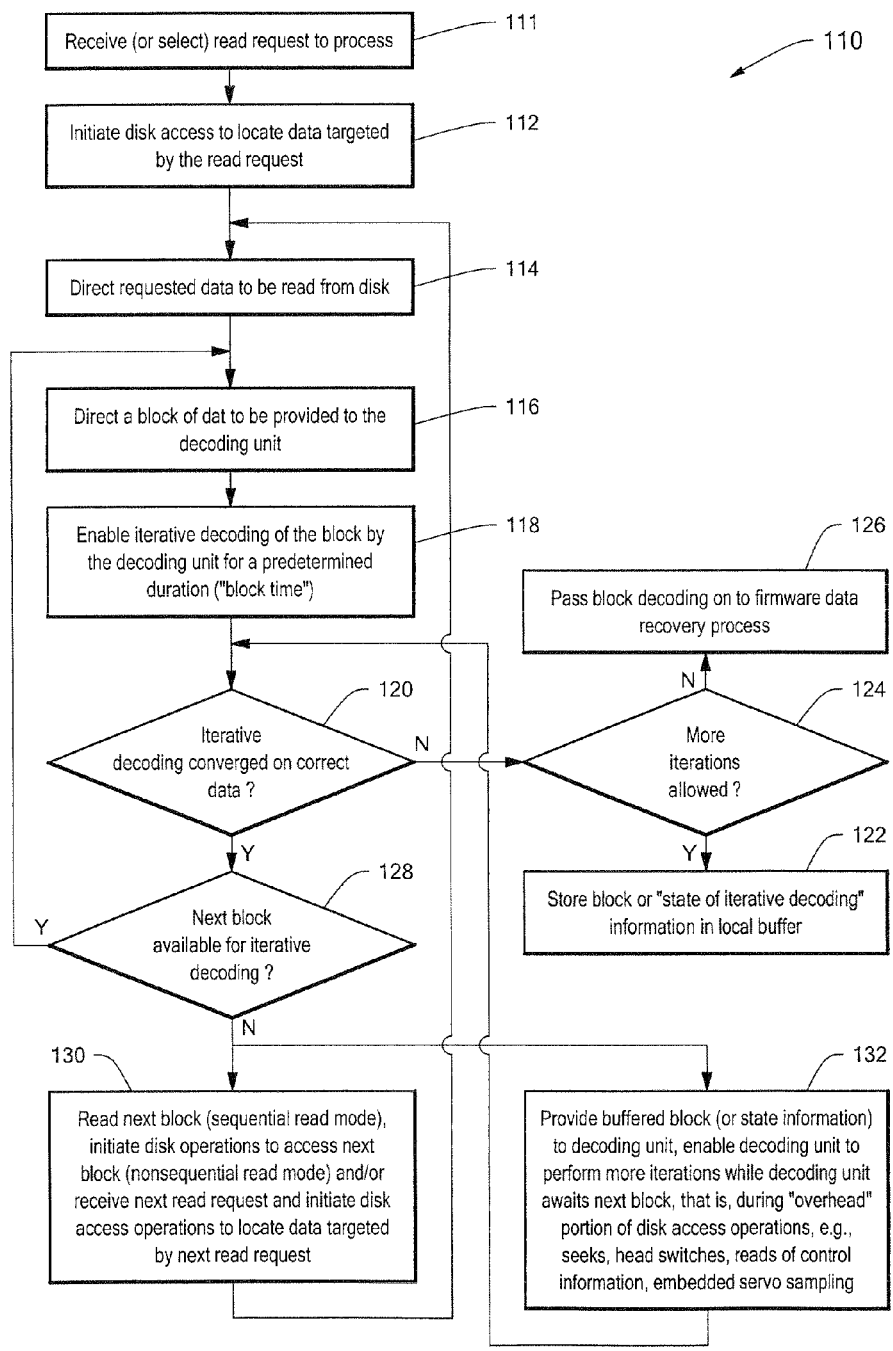
FIG. 7 is a flow diagram that illustrates the operations of the disk controller control logic during block reads and, more specifically, how the control logic controls the iterative decoding unit of FIG. 3.

Referring to FIG. 7, control operations 110 of the controller 42 during block reads, including the control of the iterative decoding unit 44 (of FIG. 3), are shown. The controller 42 begins by receiving or selecting a read request to process (step 111). The controller 42 initiates a disk access to locate data targeted by the read request (step 112). The controller 42 directs that the requested data be read from disk (step 114). Once the data is read and made available (for example, in a buffer) via the back end interface 46, the controller 42 directs a block of data to be provided to the decoding unit 44 (step 116). The controller 42 then enables the decoding unit 44 to iteratively decode the block for a predetermined duration (or block time, corresponding to "N" iterations) (step 118). The controller 42 determines from the LDPC output signals if the iterative decoding converged on the correct data (step 120). If the decoding is unsuccessful for the given number of iterations that were performed, the controller 42 stores the block or state information describing the state of the iterative decoding process (at the time at which it was terminated) in a local buffer (step 122). Optionally, the controller 42 may determine if any further iterations are allowed (step 124). For example, there may be a maximum threshold which, if exceeded, would dictate that the block in question be handed off to the firmware data recovery 23 (FIG. 1) for further processing (as indicated in step 126).

Still referring to FIG. 7, if the decoding is determined to be successful (at step 120), the controller 42 determines if another block is available (step 128). If another block is available, the controller returns to step 116. If a block is not available, the controller 42 performs one or more of the following: reads the next block (if in sequential read mode); initiates disk operations to access the next block (if in nonsequential read mode); or receives a next read request and initiates disk access operations to locate data targeted by the next read request (step 130). The controller 42 then returns to step 114. While the controller 42 is performing the operations of step 130, however, the controller 42 also provides a buffered block or buffered state information for a block to the decoding unit 44, and enables the decoder unit 44 to perform more iterations (in extended hardware decoding mode) while the storage system is occupied with overhead operations which do not utilize the decoding unit 44, for example, operations such as seeks, head switches, control information field reads, embedded servo sampling, and so forth, as discussed earlier (step 132). The controller 42 then returns to step 120 to determine the results of the decoding and whether or not the block (and/or associated state information) needs to be returned to the local buffer.

Figure 8:
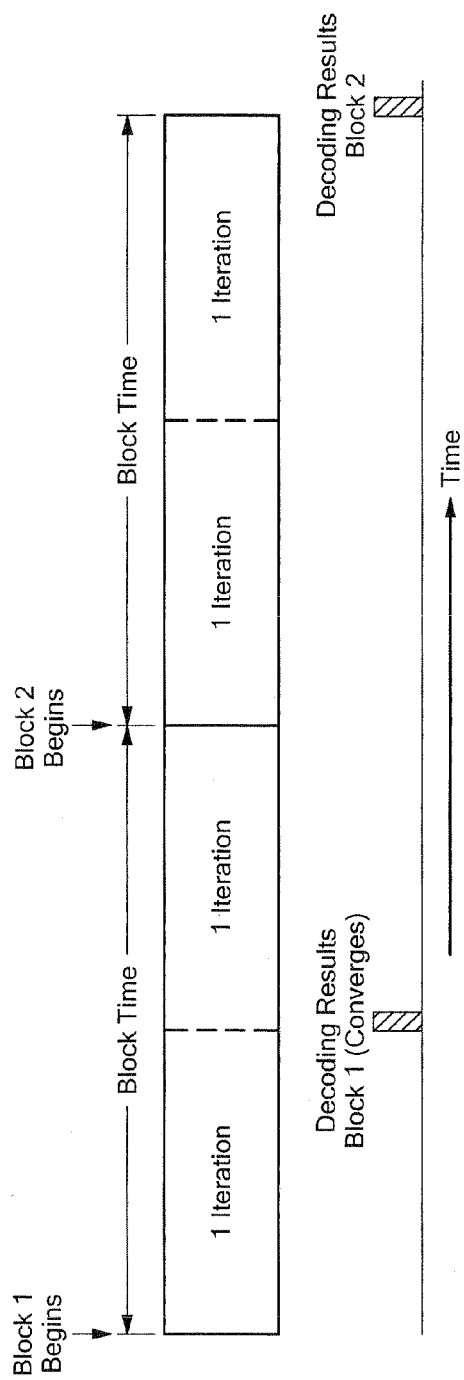
FIG. 8 is a timing diagram illustrating another exemplary embodiment of the decoder unit.

An alternative approach may be to allow blocks to share block time. For example, and as shown in FIG. 8, if a predetermined block time of N=2 "on-the-fly" hardware decoding iterations is available, and a block converges in a fraction of that time, say, after one iteration (as shown), the remaining iteration(s) allocated for the block during the predetermined block time can be used for the next block. In the example shown, the second block can perform more than N (in this example, 3) iterations for an extended hardware decoding. The second block may converge after the 3 iterations, or may need further iterations.

Figure 9:
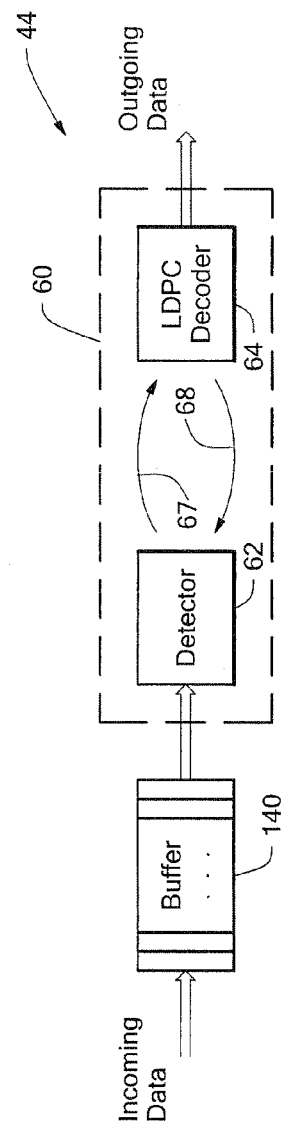
FIG. 9 is block diagram of yet another exemplary embodiment of the decoder unit.

In yet another exemplary embodiment of the decoding unit 44, and referring to FIG. 9, the incoming data and the detector 52 are separated by an "elastic" input buffer 140. That is, the incoming data transfer rate is a variable rate governed by data rate clock, seek statistics, head switches, overhead fields, and the like, while the detector/LDPC decoder may operate at a different, fixed clock rate. In such an embodiment, the detector 62 and LDPC decoder 64 collectively perform iterations until the decoding converges on the correct block data, or the input buffer 140 overflows. When the input buffer 140 overflows, the controller 42 can signal the processor 20 (FIG. 1) to initiate a firmware data recovery operation.

It will be appreciated that, for this implementation, there may be no real distinction between the "on-the fly" iterations and the additional iterations of the extended hardware decoding mode. In some cases, however, a block may need many iterations to converge. Thus, it may be desirable to impose a maximum number of allowed "on-the-fly" iterations even in the implementation of FIG. 9. The block that has not converged in the maximum number of iterations can be stored in a dedicated buffer or in the drive memory (such as DRAM 30), and processed further at a later time, as described earlier with reference to FIG. 3.

Simulations performed at different Signal-to-Noise Ratios (SNRs) have provided an iteration number histogram (i.e., how many blocks needed how many iterations to converge), which has been used to estimate how many iterations are needed to converge 1000 blocks per revolution (rev). Those numbers are provided in TABLE 1 below.

TABLE 1

| Signal-to-Noise Ratio (dB) | Iterations Required Per Revolution |
|---|---|
| 11.75 | 1450 |
| 11.50 | 1665 |
| 11.25 | 1850 |
| 11.00 | 1965 |
| 10.75 | 2023 |
| 10.50 | 2103 |
| 10.25 | 2305 |
| 10.00 | 2650 |

At a SNR of 11.75 dB, it is possible to achieve a desired on-the-fly block failure rate of $10^{-6}$ using a fixed two iterations per block. Note that by allowing a variable number of iterations and by using buffers it is possible to achieve the same performance with an average of 1.45 iterations instead of two. More importantly, it is possible to gain 1.25 dB and operate at 10.5 dB where 2103 iterations are allowed per revolution (which is only 5% above the fixed 2 iterations).

Further details of the LDPC decoding will now be described. As is well understood in the art, the LDPC decoding can be viewed as a message passing on a bipartite graph representation of the parity-check matrix. A specific LDPC code can be is modeled using a bipartite graph that consists of bit nodes (corresponding to the bits of the codeword x), and check nodes (corresponding to the parity checks), with an edge between a bit node and a check node for each corresponding "1" entry in the parity-check matrix.

One common method for decoding LDPC codes is the so-called "sum-product" (SPA) algorithm. In this algorithm, information is exchanged iteratively between the bit and check nodes of the bipartite graph. Each decoding iteration by the LPDC decoder is performed in the following manner. The LDPC decoder begins with soft information for the bits $x_i$ (where $0 \le i \le n-1$) obtained from the detector 54. During each iteration, the LDPC decoder updates messages passing from bit nodes to check nodes and messages passing from check nodes to bit nodes. At the end of one iteration, soft information for each coded bit is updated. Decoding iterations continue in this manner until a valid codeword has been reached (that is, $H*x=0$, for even parity), for a predetermined block time, or until some other condition (buffer overflow) occurs, as discussed above.

Typical decoder implementations require sequential or pipelines operations, and are thus quite demanding in terms of hardware complexity and speed. In conventional LDPC decoders, a single iteration of the LDPC decoder independently updates all of the parity constraints. For example, an LDPC with 500 rows of parity matrix H would be updated when all 500 parity constraints are updated independently, and then all the 500 updated outputs are merged. This type of update operation or scheduling scheme is referred to herein as a "parallel update". Accordingly, an LDPC decoder such as the LDPC decoder 54 may be operated to perform parallel updates according to known techniques.

Figure 10A:
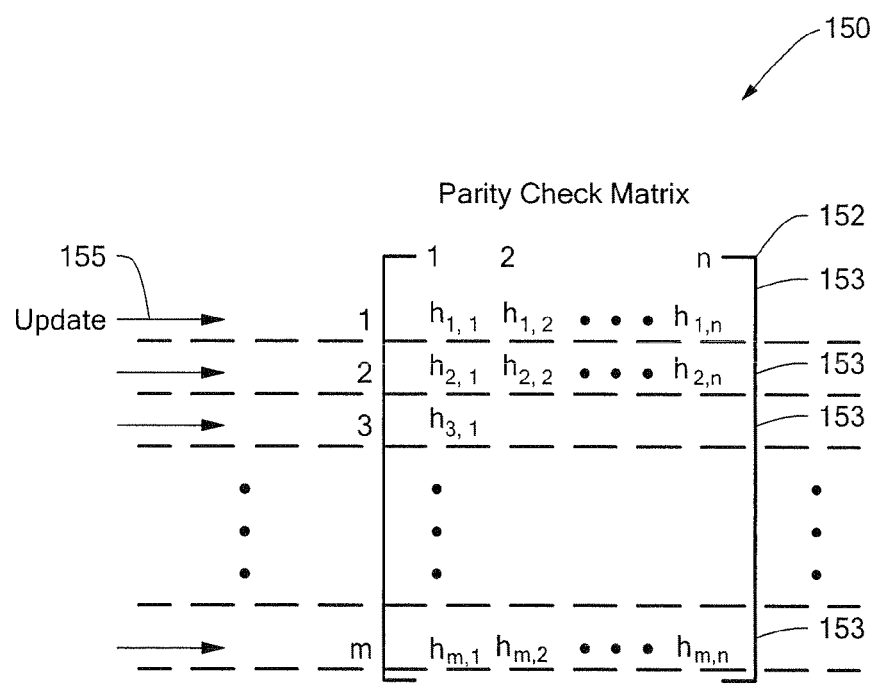
FIGS. 10A-10D are depictions of a prior art Low Density Parity Check (LDPC) decoder architecture for performing parallel updates.
Figure 10B:
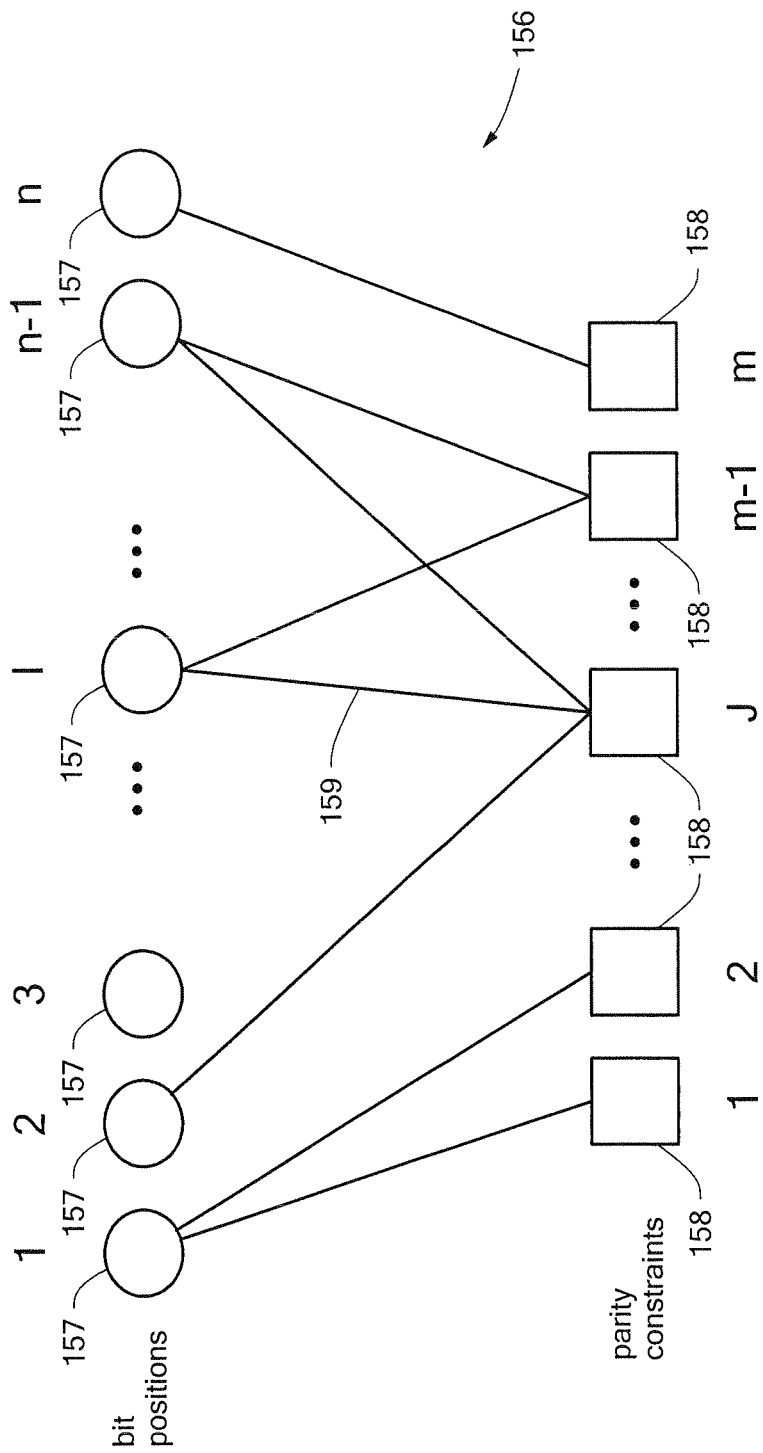
Figure 10C:
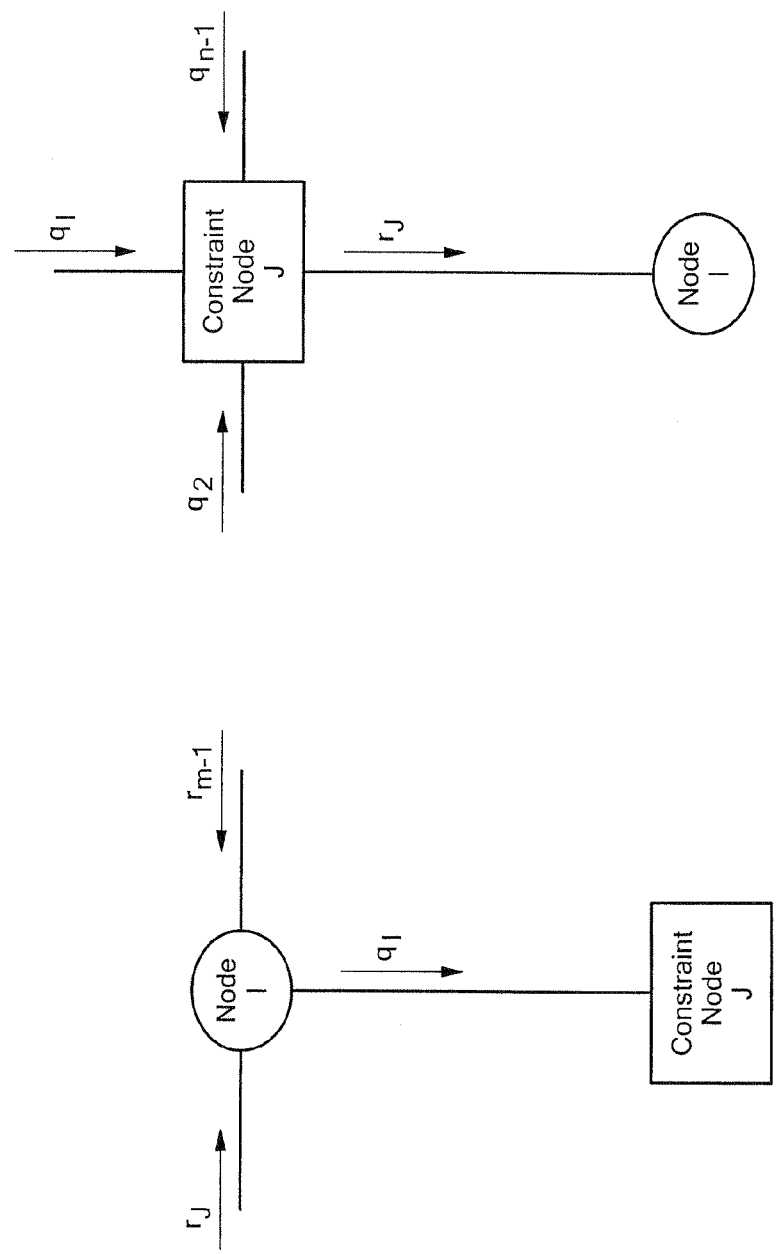
Figure 10D:
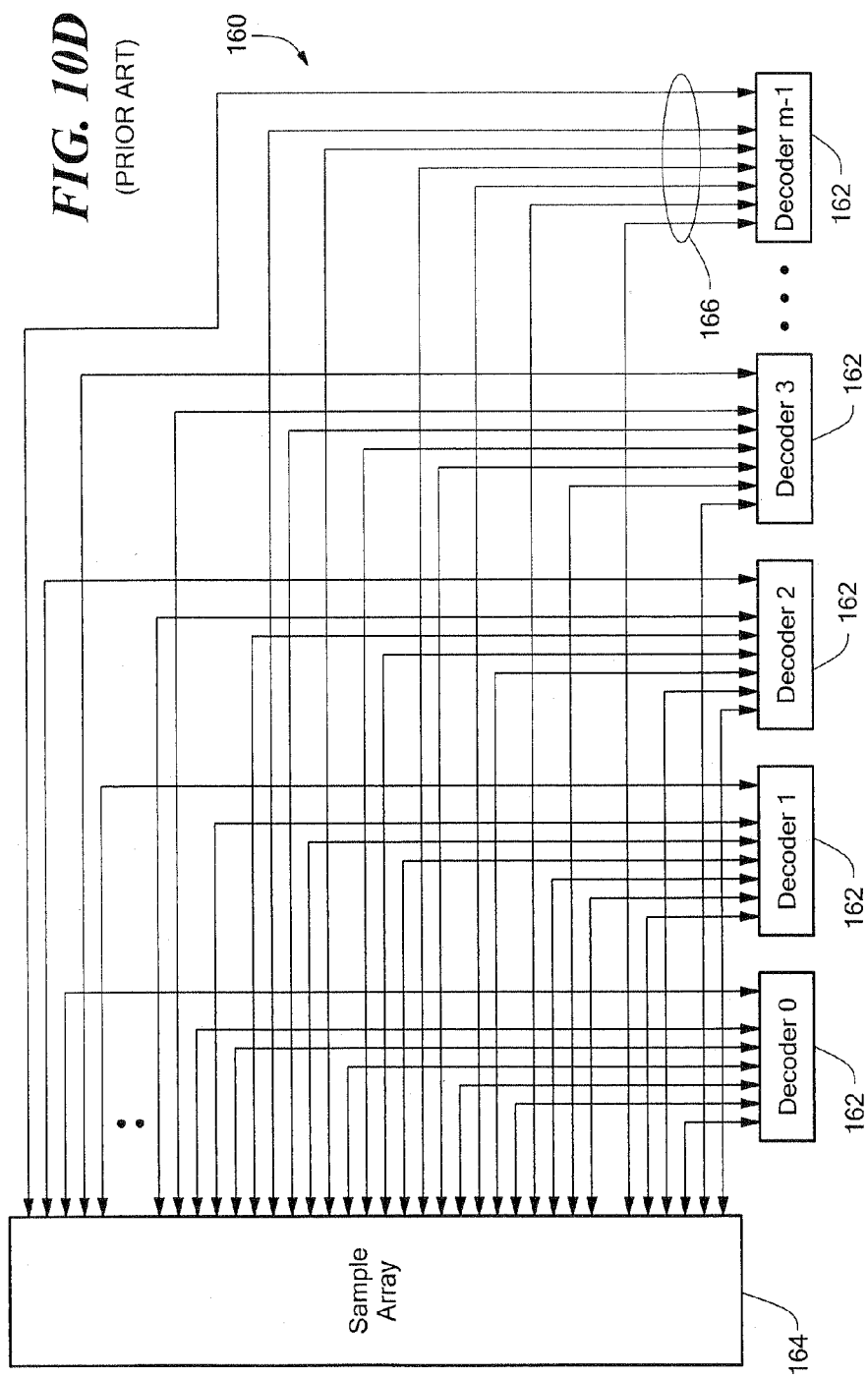

FIGS. 10A-10C illustrate an LDPC iteration processing 150 with parallel updates. FIG. 10A shows the parallel processing 150 with respect to a parity check matrix H 152. The parity check matrix 152 is an "m" by "n" parity-matrix of "m" rows 153 by "n" columns. The rows correspond to parity constraints, and each row element 154 corresponds to a bit position of an n-bit codeword "x". In the figure, arrows 155 are used to indicate "m" parallel updates.

Processing details of an iteration and a single update within an iteration can best be understood with reference to FIG. 10B, which shows a message passing graph 156 formed from the H matrix. In the message passing graph 156, upper nodes (or bit nodes "q") 157 represent the codeword bit positions and lower nodes (check or constraint nodes "r") 158 represent the parity constraints. Variable node "I" is connected to constraint node "J" by an edge 159 if the Ith position in the Jth row is a '1', that is, if $H(J,I)=1$. Thus, for the example shown, the Jth row of matrix H would have a '1' in the row elements corresponding to positions I, 2 and n−1.

An iterative decoding process can be viewed as transmitting soft information on edges 159, on both directions, on the graph 156. For example, as shown in FIG. 10C, the information transferred from bit node I to constraint node J is $q_I$, which is a function of the incoming information $r_j$, and $r_{m-1}$ from edges other than the one considered. Similarly, the information transferred from constraint node J to bit node I is $r_j$, which is a function of the incoming information $q_2$, $q_I$ and $q_{n-i}$ from edges other than the one considered. A parallel scheduling scheme operates to process all of 'r' s and the 'q's of the edges independently (and, preferably, simultaneously).

To begin, the values of the 'q's are set to initial probabilities based on the soft information received from the detector. The 'r's are then computed in parallel using the values of q. Once the 'r' s have been computed, it is possible to update the 'q's. Between iterations the values of q can be checked to see if a valid codeword has been determined.

Referring to FIG. 10B, an exemplary parallel updating LDPC decoder 160 includes "m" decoder logic units 162, each executing the decoding for the samples (of a sample array 164) in a single parity set (or row). The sample array 164 stores soft values for a data block, and all "n" entries are accessible simultaneously. The parallel implementation can be costly as it requires that all m rows be executed in parallel via the decoder units 162, each of which is wired for a particular row of the parity-check matrix via "n" lines 166. The parallel architecture is extremely fast, but somewhat impractical due to the wiring complexity and because the degree of simultaneous access obviates the use of a high speed SRAM for the sample array. Also, any sample would only receive a contribution from a single row.

Still referring to FIGS. 10A-10D, it should be emphasized that a parallel scheduling system only implies the rows are updated independently of each other. It does not imply that they are updated simultaneously. For example, updating of a first row J can be followed by the updating of a next consecutive row J+1. What is key to the parallel update is that the output of row J does not interfere with the row J+1 update. While parallel updates can be implemented to occur sequentially (rather than simultaneously), all the outputs from each row would need to be stored in an additional buffer, which is costly.

Figure 11A:
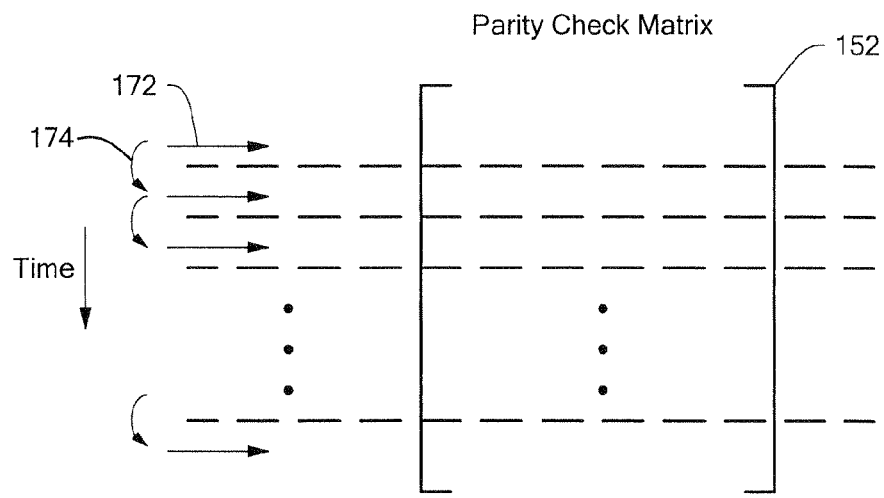
FIGS. 11A and 11B are depictions of a LDPC decoder architecture for performing sequential updates.

According to the present invention, the iterative LDPC decoder processing can be implemented in other ways so as to minimize data recovery occurrences and hence improve throughput. For example, in one embodiment, a LDPC decoder, for example, LDPC 54, may be implemented to perform sequential (as opposed to parallel) updates to improve the convergence rate of the iterative decoder. FIG. 11A illustrates an LDPC iteration processing 170 with sequential updates. In a sequential update scheme, an LDPC decoder operates to process the matrix rows sequentially so that consecutive parity constraints are updated in a sequential manner, that is, with only a single parity constraint "r" being updated at a given time and that update using the results (that is, r and q updates) based on the previous r updates. Hence, in a sequential mode of operation, a first constraint is updated, followed by the update of a second constraint using the update from first constraint, which is followed by the update of a third constraint using the updates from first and second constraints, and so forth. In the figure, arrows 172 indicate the updates, with arrows 174 reflecting the sequential nature of the operation which requires that each constraint update use the updates of the previously updated constraints.

The sequential scheduling converges in fewer iterations than parallel scheduling because each update uses the results of a previous update. When only a small number of iterations are allowed, the sequential update technique improves the convergence rate and hence imposes fewer iterations on the decoding hardware design.

Figure 11B:
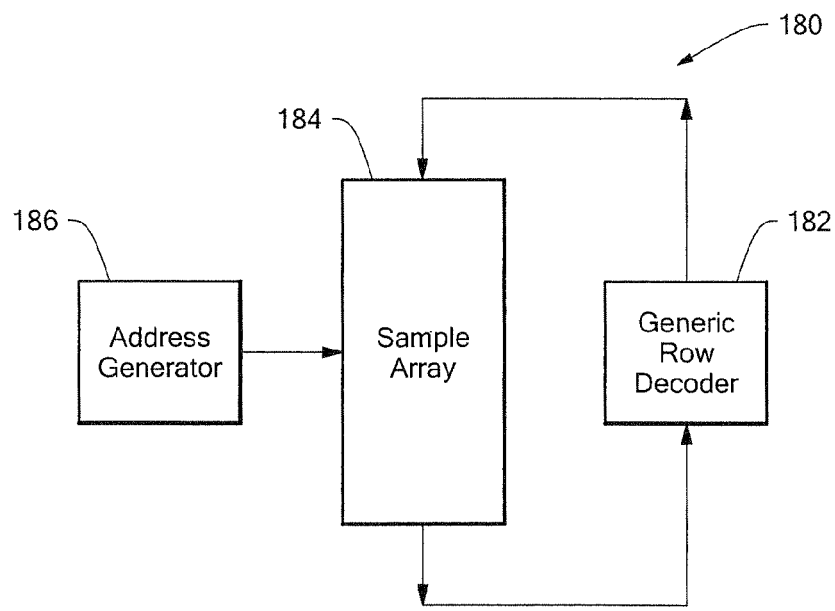

Referring to FIG. 11B, an exemplary hardware implementation of a sequentially updating LDPC decoder 180 is shown. Unlike the decoder 160 shown in FIG. 10B, the decoder 180 requires only a single decoder unit (indicated as generic row decoder 182), as that single decoder unit serves as a generic row decoder by updating a row at a time. In other words, the decoder 182 executes the decoding for all parity sets, one after the other. In this implementation, a generic single-port SRAM could be used for a sample array 184. An address generator 186 is coupled to the sample array 184 and generates matrix row addresses.

Thus, the sequential update implementation has the advantage of the fully sequential row updates, but may be impractical for a system that must keep up with throughput of the disk heads. Assume, for example, that each decoder reads 20 samples and writes back 20 samples, consuming one clock cycle per access, for a total of 40 cycles. For one decoder unit to handle 700 rows would require 700×40=28,000 cycles. Also, generating the address of random, sparse row members for a matrix of such a size would require a very large table.

Figure 12A:
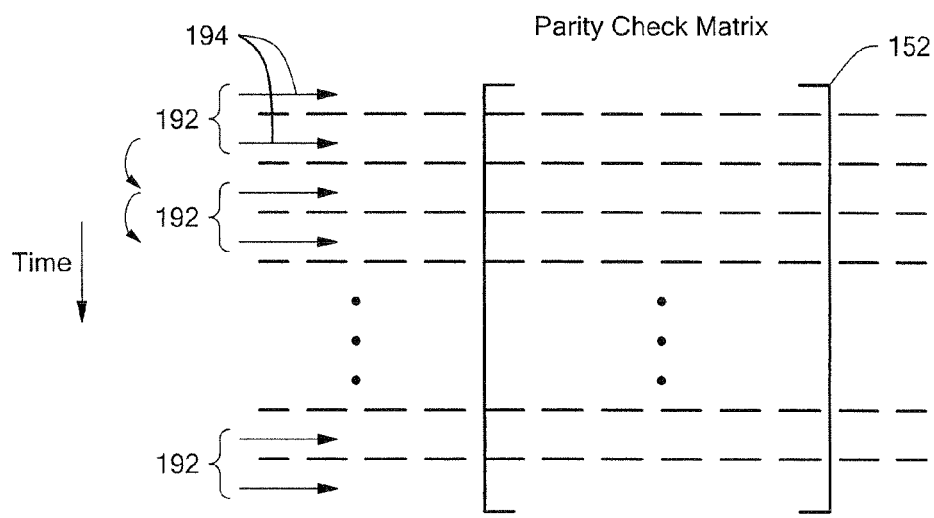
FIGS. 12A and 12B are depictions of a LDPC decoder architecture for performing updates in a "hybrid" parallel/sequential manner.

In an alternative embodiment, the LDPC decoder can use a combination of parallel and sequential updates for a "hybrid" scheduling scheme. FIG. 12A illustrates an LDPC iteration processing 190 with hybrid updates. In a hybrid scheduling scheme, as shown, a subset "k" of the "m" constraints are updated in parallel. The "k" parallel updates are indicated by arrows 194. In the illustrated example, k=2, but it will be understood that "k" may be any desired integer value. The processing of each update group 192 (of "m/k" update groups) of "k" parallel updates occurs sequentially. For example, consider a LDPC code having 750 constraints and a "k" value of 50 for a parallel update of 50 constraints at a time. After m/k (or, for the example, 750/50=15) groups of parallel updates have occurred, a single iteration would be complete. Since each subset of "k" constraints uses the results of the previous subset (for example, for k=50, a second subset of lines 51 to 100 uses the update of the first subset of lines 1 to 50), the hybrid mechanism incorporates aspects of and has similarities to both parallel and sequential scheduling.

Figure 12B:
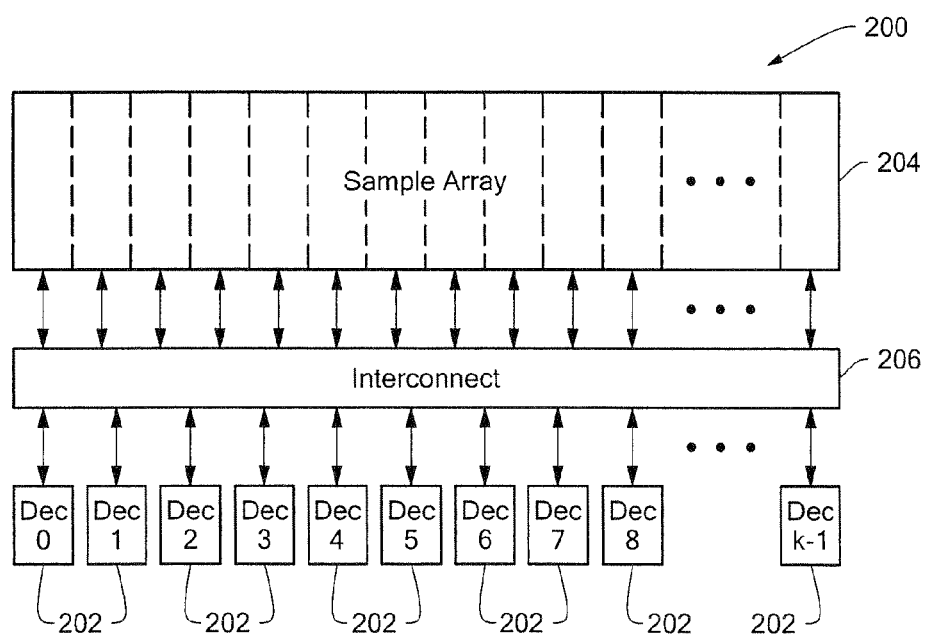

Referring to FIG. 12B, an exemplary hardware implementation of a LDPC decoder 200 that can perform hybrid updates is shown. The LDPC decoder includes an array of k decoder boxes 202, which are coupled to a sample array 204 via an interconnect 206, and operate to update "k" parity sets at a time. Orthogonality allows parallel execution without contention or compromise. This architecture makes multiple samples accessible to the array of decoder units 202 each clock cycle.

While the decoding mechanisms such as the extended hardware decoding as well as the sequential and hybrid LDPC iterative decoding have been described within the context of a disk drive system, it will be appreciated that such decoding mechanisms may be used in other applications. For example, the data channel could be a communications channel and the decoding mechanisms could be employed by a network receiver that receives data packets over the communications channel. The extended mode could occur while the network receiver parses and processes overhead information in a data packet being received. The sequential and hybrid decoding techniques are applicable to any LDPC decoder, whether that LDPC decoder is being used in a storage system application or some other type of application.

It is to be understood that while the invention has been described in conjunction with the detailed description thereof, the foregoing description is intended to illustrate and not limit the scope of the invention, which is defined by the scope of the appended claims. All publications and references cited herein are expressly incorporated herein by reference in their entirety.

What is claimed is:

1. A method comprising:
receiving soft information regarding a codeword at an iterative low density parity check ("LDPC") decoder, by a decoder unit, that operates according to a parity check matrix arranged as a plurality of ordered rows each corresponding to a parity constraint;
performing updates of the soft information at the iterative decoder for a particular iteration by processing the ordered rows sequentially, each consecutive parity constraint of an ordered row being updated sequentially one parity constraint at a time using results based on previous parity constraint updates of the particular iteration; and
converging on the codeword after the particular iteration.

2. The method as in claim 1, further comprising:
operating a single-port static random access memory ("SRAM") to update each parity constraint; and
generating matrix row addresses corresponding to each parity constraint as each parity constraint is to be updated by the single-port SRAM.

3. The method as in claim 1, further comprising:
updating a subset of parity constraints in parallel.

4. The method as in claim 3, further comprising:
operating a plurality of decoder units; each decoder unit to process updates for a given sub set.

5. The method as in claim 1, further comprising:
transmitting the soft information after the particular iteration to a channel detector for one or more channel iterations between the channel detector and the iterative decoder.

6. The method as in claim 1, further comprising:
receiving the soft information regarding the codeword from a data channel.

7. The method as in claim 6, wherein the data channel is a communication channel, the method further comprising:
receiving the codeword as one or more data packets from the communication channel.

8. The method as in claim 1, further comprising:
utilizing a single decoder unit for the decoder.

9. An iterative low density parity check ("LDPC") decoder comprising:
a parity-check matrix arranged as a plurality of ordered rows each corresponding to a parity constraint;
circuitry configured to receive soft information for a codeword; and
a single generic row decoder unit configured to update a single ordered row at a time and to execute decoding for all parity constraints, the decoding comprising i) performance of sequential updates of the soft information received for the codeword for a particular iteration by processing the matrix rows sequentially, each consecutive parity constraints of an ordered row being updated sequentially one parity constraint at a time using results based on previous parity constraint updates of the particular iteration and ii) convergence on the codeword after the particular iteration.

10. The iterative LDPC decoder as in claim 9, further comprising:
   a single-port static random access memory ("SRAM") as the single generic row decoder unit; and
   an address generator to generate matrix row addresses corresponding to each parity constraint as each parity constraint is to be updated by the single-port SRAM.

11. The iterative LDPC decoder as in claim 9, wherein a subset of parity constraints are updated in parallel, the single generic row decoder unit comprising:
   a plurality of decoder units, each decoder unit configured to process updates for a given sub set.

12. An apparatus, comprising:
   a parity-check matrix arranged as a plurality of ordered rows each corresponding to a parity constraint;
   circuitry configured to receive soft information for a codeword; and
   a single generic row decoder unit configured to update a single ordered row at a time and to execute decoding for all parity constraints, the decoding comprising performance of sequential updates of the soft information received for the codeword for a particular iteration by processing the matrix rows sequentially, each consecutive parity constraints of an ordered row being updated sequentially one parity constraint at a time using results based on previous parity constraint updates of the particular iteration.

13. The apparatus of claim 12, wherein the decoding further comprises convergence on the codeword after the particular iteration.

14. The apparatus of claim 12, wherein a subset of parity constraints are updated in parallel.

15. The apparatus of claim 14, wherein the single generic row decoder unit comprising a plurality of decoder units, each decoder unit configured to process updates for a given subset.

16. The apparatus of claim 12, wherein the circuitry is configured to receive the soft information regarding the codeword from a data channel.

17. The apparatus of claim 16, wherein the data channel is a communication channel.

18. The apparatus of claim 17, wherein the circuitry is configured to receive the codeword as one or more data packets from the communication channel.

19. The apparatus of claim 12, wherein the decoder comprises a single decoder unit.

* * * * *